United States Patent
Cova et al.

(10) Patent No.: US 6,504,428 B2
(45) Date of Patent: Jan. 7, 2003

(54) HIGH LINEARITY MULTICARRIER RF AMPLIFIER

(75) Inventors: Armando C. Cova, Sunnyvale, CA (US); Emil J. Crescenzi, Jr., Cambria, CA (US); Augustin P. Chang, Cupertino, CA (US); Stephen J. Foley, Santa Clara, CA (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 09/859,720

(22) Filed: May 16, 2001

(65) Prior Publication Data

US 2002/0008577 A1 Jan. 24, 2002

Related U.S. Application Data

(60) Provisional application No. 60/205,710, filed on May 19, 2000.

(51) Int. Cl.[7] .............................. H03F 3/66; H03F 1/26; H03F 1/00
(52) U.S. Cl. ........................ 330/52; 330/149; 330/151
(58) Field of Search ............................. 330/52, 149, 151

(56) References Cited

U.S. PATENT DOCUMENTS

| | | | |
|---|---|---|---|
| 5,304,945 A | * 4/1994 | Myer | 330/149 |
| 5,323,119 A | 6/1994 | Powell et al. | 330/151 |
| 5,386,198 A | 1/1995 | Ripstrand et al. | 330/52 |
| 5,444,418 A | * 8/1995 | Mitzlaff | 330/151 |
| 5,493,252 A | 2/1996 | Takai | 330/52 |
| 5,691,668 A | * 11/1997 | Yoshikawa et al. | 330/151 |
| 5,760,646 A | 6/1998 | Belcher | 330/149 |
| 5,789,927 A | 8/1998 | Belcher | 330/2 |
| 5,815,036 A | * 9/1998 | Yoshikawa et al. | 330/151 |
| 6,104,241 A | 8/2000 | Cova et al. | 330/149 |
| 6,111,462 A | 8/2000 | Mucenieks et al. | 330/149 |

* cited by examiner

*Primary Examiner*—Patricia Nguyen
(74) *Attorney, Agent, or Firm*—Allen, Dyer, Doppelt Milbrath & Gilchrist, P.A.

(57) ABSTRACT

A hybrid multicarrier RF power amplifier linearization architecture combines ACT and feed-forward amplifier stages to achieve high output distortion rejection and enhanced amplifier linearity. A carrier cancellation loop is coupled with a main RF power amplifier stage having parallel RF power amplifiers coupled via intermod-complementing predistortion paths. The carrier cancellation loop is coupled to a feed-forward loop containing a feed-forward RF power amplifier, to produce a composite amplified output signal having very reduced intermodulation products. Vector modulators in the main amplifier and feed-forward amplifier stages are controlled by a digital signal processor, using outputs from various monitoring subsystems, including pilot tone detection, correlator, distortion and power detector circuits.

20 Claims, 5 Drawing Sheets

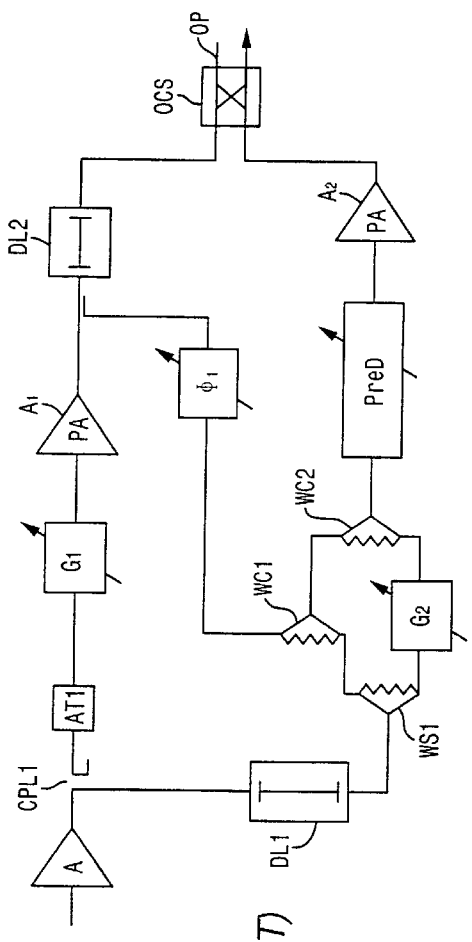
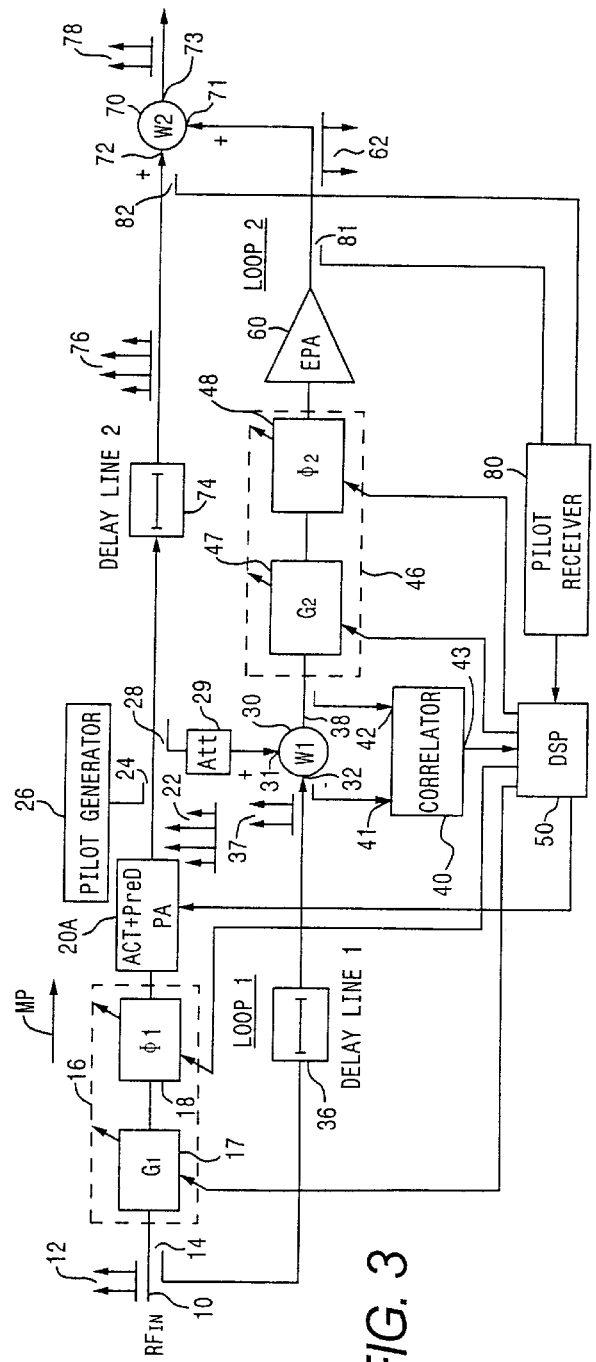
FIG. 4
(PRIOR ART)
FIG. 3

HIGH LINEARITY MULTICARRIER RF AMPLIFIER

CROSS-REFERENCE TO RELATED APPLICATION

The present application claims the benefit of co-pending U.S. Provisional Patent Application Ser. No. 60/205,710, filed May 19, 2000, by A. Cova et al, entitled: "High Linearity Multicarrier RF Amplifier," assigned to the assignee of the present application and the disclosure of which is incorporated herein.

FIELD OF THE INVENTION

The present invention relates in general to communication systems, and is particularly directed to a hybrid RF power amplifier linearization mechanism that provides very high output distortion rejection and enhanced amplifier linearity. This hybrid architecture includes a main RF amplifier stage coupled with a carrier cancellation loop, the extracted residual distortion output of which feeds a feed-forward loop containing an auxiliary error amplifier stage. The main RF power amplifier stage is configured of a pair of parallel RF power amplifiers installed in intermod-complementing pre-distortion paths of the type disclosed in the U.S. Patent to Mucenieks, No. 6,111,462 (hereinafter referred to as the '462 patent and the disclosure of which is incorporated herein). The outputs of the main and auxiliary amplifier stages are combined to produce a composite amplified RF output signal having very substantially reduced intermodulation products.

BACKGROUND OF THE INVENTION

Communication service providers are subject to very strict bandwidth usage spectrum constraints, including technically mandated specifications and regulations imposed by the Federal Communications Commission (FCC). These rules require that sideband spillage, namely the amount of energy spillover outside a licensed band of interest, be sharply attenuated (e.g., on the order of 50 dB). Although these regulations may be easily met for traditional forms of modulation, such as FM, they are difficult to achieve using more contemporary, digitally based modulation formats, such as M-ary modulation.

Attenuating the sidebands sufficiently to meet industry and regulatory-based requirements by such modulation techniques requires very linear signal processing systems and components. Although linear components can be produced at a reasonable cost at the relatively narrow bandwidths (baseband) of telephone networks, linearizing inherently non-linear components such as RF power amplifiers can be prohibitively expensive.

A fundamental difficulty in linearizing RF power amplifiers is the fact that they generate unwanted intermodulation distortion products (IMDs) which manifest themselves as spurious signals in the amplified RF output signal, such as spectral regrowth or spreading of a compact spectrum into spectral regions that do not appear in the RF input signal. This distortion causes the phase/amplitude of the amplified output signal to depart from the phase/amplitude of the input signal, and may be considered as an incidental (and undesired) amplifier-sourced modulation of the RF input signal.

An inefficient approach to linearizing an RF power amplifier is to build the amplifier as a large, high power device, and then operate the amplifier at a low power level (namely, at only a small percentage of its rated output power), where the RF amplifier's transfer characteristic is relatively linear. An obvious drawback to this approach is the overkill penalty—a costly and large sized RF device.

Other prior art linearization techniques include baseband polar (or Cartesian) feedback, post-amplification, feed-forward correction, and pre-amplification, pre-distortion correction. In the first approach, the output of the RF power amplifier is compared to the input, and a baseband error signal is used to directly modulate the signal which enters the amplifier. In the second approach, error (distortion) present in the RF amplifier's output signal is extracted, amplified to the proper level, and then reinjected (as a complement of the error signal back) into the output path of the amplifier, so that (ideally) the RF amplifier's distortion is effectively canceled.

Pursuant to a third approach, a predistortion signal is injected into the RF input signal path upstream of the RF amplifier. Ideally, the predistortion signal has a characteristic equal and opposite to the distortion expected at the output of the RF amplifier. As a result, when subjected to the (distorting) transfer characteristic of the RF amplifier, it effectively cancels the distortion in the output. Predistortion may be made adaptive by measuring the distortion at the output of the RF amplifier and adjusting the predistortion control signal to minimize the distortion of the output signal of the power amplifier during real time operation.

In accordance with the invention described in the above-referenced '462 Patent, and diagrammatically illustrated in FIG. 1, high efficiency RF power amplifier linearization is achieved by coupling a pair of effectively matched RF power amplifiers $A_1$ and $A_2$ in circuit with one another in a manner that causes one RF power amplifier to 'pre-distort' the other. For purposes of the present discussion, this parallel configured, effectively matched amplifier predistortion architecture will be referred to as an active cancellation technique (ACT) amplifier architecture. Being effectively matched implies that the two RF power amplifiers $A_1$, $A_2$ have essentially the same transfer characteristics—both in terms of their intended RF performance and unwanted IMD components they inherently introduce into their amplified outputs.

As shown in FIG. 1, an RF input signal to be amplified is split by a directional coupler CPL1 into two paths. A first path includes an attenuator or scaling pad ATT and a controlled gain adjustment G1, which serve to adjust the RF input signal in amplitude prior to being amplified by the main amplifier $A_1$. The output of the main path amplifier $A_1$ is coupled through a delay stage DL2 to a first input of an output combining stage OCS (such as a quadrature hybrid).

A second split RF input signal path is used to construct a signal containing both of the original RF input signal to be amplified by the second amplifier $A_2$, and a complementary version of the IMD products each of the two amplifiers inherently introduces. Distortion is extracted using carrier cancellation combiner circuitry very similar to that found in most conventional feed-forward RF power amplifiers. The extracted distortion products are adjusted in amplitude and phase and combined with an appropriately delayed sample of the RF input signal.

For this purpose, the second path from the directional coupler CPL1 is coupled though a delay stage DL1 to a first input of a Wilkinson splitter WS1, a first output of which is coupled to a first Wilkinson combiner WC1. A second output of Wilkinson splitter WS1 is coupled through a variable gain stage G2 to a first input of a second Wilkinson combiner WC2, a second input of which is coupled to the output of the first Wilkinson combiner WC1. A second input of the first Wilkinson combiner WC1 is coupled through a variable phase adjustor Φ1 to a directional coupler CPL2 installed in the output path of the main path amplifier $A_1$.

The output of the second Wilkinson combiner WC2, which is a composite of the RF input signal and distortion products extracted from the first or main matched RF amplifier $A_1$, is coupled through a variable gain stage G3 and variable phase adjustor Φ2 to the second matched or error RF amplifier $A_2$. Namely, the error amplifier $A_2$ is driven by the distortion products extracted from the main amplifier $A_1$. The output of the second matched RF amplifier $A_2$ is coupled to a second input of the output combining stage OCS.

The amplitude of the RF input signal component of the composite RF signal driving the error amplifier $A_2$ is adjusted to be the same as the amplitude of the pure RF input signal driving the main amplifier $A_1$. Namely, the phase and amplitude of the distortion products are adjusted so that they not only cancel the distortion products generated by the input signals applied to the error amplifier $A_2$, but also replace these distortion products with equal amplitude anti-phase replicas of these products. Thus, the delayed output of the main amplifier $A_1$ and the undelayed output of the matched error amplifier $A_2$ contain equal phase and amplitude amplified RF input signals and equal amplitude anti-phase distortion products. As a consequence, distortion components resulting from the RF input signal components driving both the main and error amplifiers are essentially the same.

In the output combining stage OCS, these signals are summed, so that the (desired) amplified RF signals add and the (unwanted) distortion products cancel. The output from the combining stage OCS is therefore an amplified version of the RF input signal, that is substantially free of distortion, even though both the main and error amplifiers contain distortion products at their outputs. Both the main and error amplifiers contribute essentially equal amounts of amplified signal power to the output of the overall amplifier system. Operating efficiency is better than that of a conventional feed forward amplifier because the entirety of the error amplifier output power appears at the output of the combining stage.

It should be noted that the ACT architecture of FIG. 1 is not a conventional feed-forward amplifier. Rather, it is a very effective type of RF pre-distortion amplifier structure, in which the source of the energy used to pre-distort the error amplifier is produced by an identical (main) amplifier that is driven by essentially the same input signals as the error amplifier. The level of the distortion components of the energy driving the error amplifier is approximately 30 dB below the RF input signal component. Thus, the dynamics of both amplifiers is controlled by the dominant input signal energy.

Now although the ACT amplifier-based linearization scheme described in the '462 Patent architecture is very effective in achieving non-linear distortion rejection at least on the order of 50 dB and greater, third generation (3G) time division multiple access (TDMA) multicarrier RF power amplifiers must attain very high distortion rejection levels (e.g., on the order of −65 to −75 dBc) which are not achievable in the ACT architecture.

SUMMARY OF THE INVENTION

Pursuant to the invention, this increased distortion rejection requirement is realized by a hybrid combination of two distinct linearization techniques—an ACT amplifier stage, and an associated a feed-forward amplifier (FF) stage. Compared to a classical feed-forward design, the hybrid scheme of the present invention is capable of achieving very large IMD suppression due to the use of an ACT power amplifier stage rather than a conventional class AB power amplifier.

In accordance with a first embodiment of the invention, a main amplifier stage, to which a multicarrier RF signal is applied, is configured as an ACT power amplifier stage of the type disclosed in the '462 Patent. A main RF signal flow path to the ACT power amplifier stage includes a processor-controlled vector modulator containing a variable gain stage and a processor-controlled variable phase shifting stage. The ACT power amplifier stage is embedded in a multicarrier cancellation loop that estimates the residual distortion in the output of the amplifier. Multitone pilot signals are injected into the amplifier's output signal path and are used in conjunction with a pilot tone receiver to control amplitude and phase alignment of signals in the feed-forward loop.

A portion of the combined pilot tone and amplified output signal is coupled to a carrier cancellation combiner of the first loop. A second input of the carrier cancellation combiner is coupled through a delay line to the RF input port. A portion of the RF input signal delayed through the first delay line is also applied to a correlator. The carrier cancellation combiner provides an estimate of the residual distortion produced by the ACT power amplifier.

Carrier rejection in the first loop is optimized by a digital signal processor (DSP)-controlled regulator that computes the correlation between the output signal from the carrier cancellation combiner and the delayed RF input signal. The DSP processes the output signals from the correlator to derive control signals for setting the parameters of the variable attenuator and phase shifter of the vector modulator in the input path to the ACT power amplifier. The output of the carrier cancellation combiner is coupled to a second (feed-forward) signal processing loop (Loop 2), which contains a variable gain stage and a variable phase shifter of a vector modulator installed in the input path of a feed-forward error amplifier. The DSP also controls the operation of the ACT amplifier, as described in the '462 patent.

Pilot tones detected by a pilot tone receiver are coupled to the digital signal processor which measures the degree of amplitude and phase match of the detected pilot signals, and drives the variable attenuator and the phase shifter in the input path to the loop 2 error amplifier to reduce distortion. The loop 2 feed-forward error amplifier amplifies gain and phased adjusted residual power amplifier distortion and applies it to an output combiner. The output combiner also receives a delayed pilot tone-injected output of the ACT power amplifier. The output combiner recombines the amplified feed-forward signal anti-phase with a delayed version of the output signal from main path ACT power amplifier stage, to realize very high distortion suppression.

In a second embodiment of the invention, the ACT power amplifier stage is replaced by a modified ACT power amplifier stage, in which the variable attenuator and phase adjustor components in the input path to the feed-forward RF amplifier of the ACT stage are replaced by a controlled predistortion (or PreD) unit, such as that described in U.S. Pat. No. 6,104,241 (hereinafter referred to as the '241 Patent) to A. Cova et al, assigned to the assignee of the present application and the disclosure of which is incorporated herein. This augmented linearity (high efficiency feed-forward RF amplifier with predistortion enhancement) main path amplifier rejects higher levels of output intermodulation distortion (IMD), does not require accurate matching of the main and auxiliary amplifiers (A1, A2) and operates essentially as the first embodiment.

Pursuant to a third embodiment of the invention, the correlator of the first embodiment is replaced by a power detector. The DSP executes error minimization algorithms using the output of the power detector to generate signals for controlling the variable attenuator and phase shifter components in the input path to ACT power amplifier stage.

In a fourth embodiment of the invention, the pilot tone generator and receiver components for controlling loop 2 are removed. Instead, loop 2 is controlled by the DSP, using signals from an output distortion detector (performance monitor) coupled to the output combiner, so as to adaptively control the variable attenuator and the phase shifter in the feed-forward loop to minimize the output distortion. The fourth embodiment offers improved amplifier linearity due to the fact that the distortion detector continuously monitors the distortion at the output of the amplifier and uses this information to optimize distortion cancellation in loop 2.

A fifth embodiment of the invention integrates features of the first four embodiments to realize specific performance, complexity and cost objectives, such as the use of a loop 1 DSP controller, ACT+PreD amplifier stage, and distortion detector based control of loop 2. The fifth embodiment employs a distortion detector in place of the pilot tone generator and receiver components for controlling loop 2 and incorporates the ACT+PreD power amplifier of the second embodiment, as well as the detected power minimization scheme of the third embodiment in place of the correlator controller.

BRIEF DESCRIPTION OF THE DRAWINGS

FIGS. 3 and 4 diagrammatically illustrate a second embodiment of the present invention employing an ACT+Pred power amplifier stage and correlation-based carrier cancellation;

DETAILED DESCRIPTION

Figure 1:
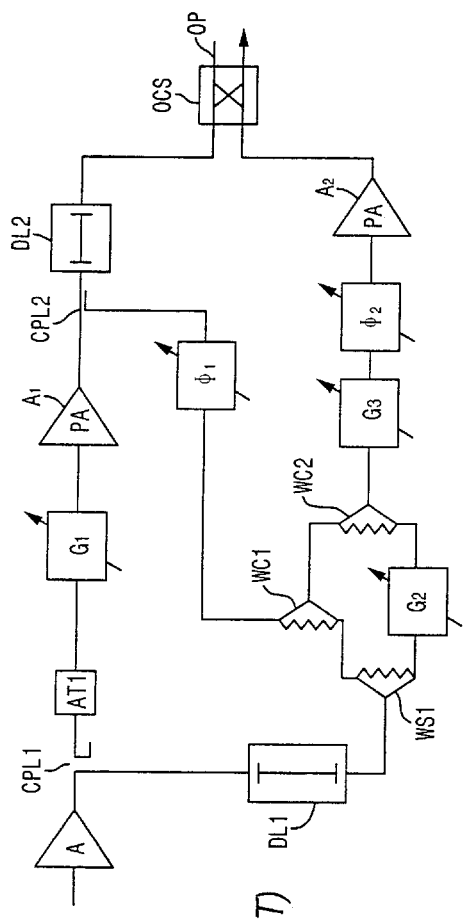
FIG. 1 diagrammatically illustrates an ACT-stage based RF power amplifier linearization mechanism in accordance with the invention disclosed in the above-referenced '462 Patent.

Before detailing the new and improved hybrid, high linearity multicarrier RF power amplifier linearization mechanism in accordance with the present invention, it should be observed that the invention resides primarily in what is effectively a prescribed arrangement of conventional RF communication circuits and associated digital signal processing components and attendant supervisory control circuitry, that controls the operations of such circuits and components. Consequently, the configuration of such circuits components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein.

Thus, the block diagram illustrations are primarily intended to show the major components of a parallel RF amplifier distortion correction system in a convenient functional grouping, whereby the present invention may be more readily understood. In addition, to facilitate an understanding of signal processing flow through the respective paths of the linearization system of the various embodiments of the invention, reduced complexity spectral diagrams of the desired modulated RF carrier and the unwanted IMD components have been placed throughout the Figures in association with respective transfer characteristics of the system components.

Figure 2:
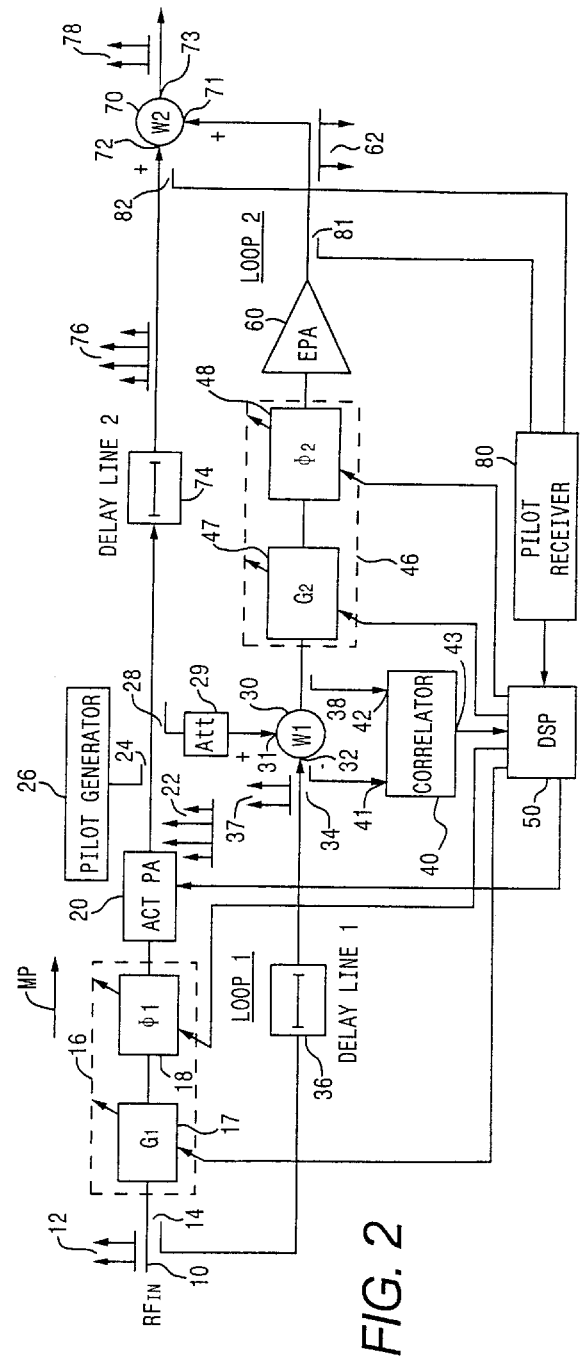
FIG. 2 diagrammatically illustrates a first embodiment of the hybrid high linearity multicarrier RF power amplifier of the present invention employing correlation-based carrier cancellation.

Referring now to FIG. 2, a first embodiment of the hybrid, high linearity multicarrier RF power amplifier of the present invention is diagrammatically illustrated as comprising an input terminal 10 to which a multicarrier RF input signal $RF_{IN}$ to be amplified (pictorially represented by a carrier frequency pair 12) is applied. Input terminal 10 is coupled through a directional coupler 14 along a main signal flow path (designated by arrow MP) to a first vector modulator 16 installed in the input path of a main RF amplifier stage 20. The vector modulator unit 16 contains a (processor) controlled variable gain (attenuator) stage 17 and a (processor) controlled variable phase shifting stage 18 cascaded with the variable gain stage 17.

The main RF power amplifier stage 20 (labelled as ACT PA) is configured as an ACT power amplifier stage of the type disclosed in the '462 Patent and shown in FIG. 1, described above, and is embedded in a (multicarrier) signal cancellation loop (Loop 1) that estimates the residual distortion (shown in the spectral diagram 22) at the output of the power amplifier 20. The output of the main RF power amplifier stage 20 is coupled to a directional coupler 24, through which multitone signals from a pilot tone generator 26 are injected into the RF amplifier output signal path. As will be described, pilot tone generator 26 is used in conjunction with a pilot tone receiver 80, to control amplitude and phase alignment of the signals in a feed-forward loop 2.

A portion of this combined pilot tone and amplified output signal from the main path amplifier 20 is extracted via a further directional coupler 28 and coupled through an (output-scaling) attenuator pad 29 to a first input port 31 of a carrier cancellation (Wilkinson) combiner 30. A second input port 32 of carrier cancellation combiner 30 is coupled through a directional coupler 34 to a first delay line 36 installed in the second signal flow path from the directional coupler 14. Directional coupler 34 extracts a portion of the RF input signal delayed through the first delay line and applies it to a first input 41 of a correlator 40.

The delay imparted by the delay line 36 (producing the delayed version of in the input RF signal shown at 37) corresponds to the delay in the signal path through the power amplifier 20, thereby ensuring adequate time alignment between the signals applied to the carrier cancellation combiner 30. By subtracting a scaled version of the output of amplifier 20 from the RF input signal delayed through the first delay line 36, the carrier cancellation combiner 30 provides an estimate of the residual distortion produced by the power amplifier 20.

Carrier rejection in loop 1 is optimized by a digital signal processor (DSP)-controlled regulator that computes the correlation between the output signal from the carrier cancellation combiner 30 and the RF input signal delayed through the delay line 36. For this purpose, a portion of the output of the carrier cancellation combiner 30 is extracted through a directional coupler 38 and applied to a second input 42 of the correlator 40. A DSP 50, to which the output 43 of the correlator 40 is coupled, processes the output signals from the correlator 40 to derive control signals for setting the parameters of the variable attenuator stage 17, and variable phase shifter 18 of the vector modulator 16, in order to control amplitude and phase matching between the input signals to the carrier cancellation combiner 30. The DSP 50 also controls the operation of the ACT amplifier, in a manner similar to the one described in the '462 patent.

The output of the carrier cancellation combiner 30 is coupled to a second (feed-forward) signal processing loop 2, which contains a second vector modulator 46 installed in the input path of a feed-forward error amplifier stage 60. Like the first vector modulator 16, the second vector modulator 46 contains a (processor) controlled variable gain (attenuator) stage 47 and a (processor) controlled variable phase shifting stage 48 cascaded with the variable gain stage 47. The loop 2 error amplifier 60 amplifies gain and phased adjusted residual power amplifier distortion derived from the carrier cancellation combiner 30 in loop 1.

This amplified residual distortion signal (shown in spectral diagram 62) is coupled to a first input 71 of an output combiner 70, a second input 72 of which is coupled through a second delay line 74 to the pilot tone-injected output path from the main amplifier 20. Similar to the use of delay line 36, the delay imparted by the second delay line 74 equals the signal propagation delay through the error amplifier path and serves to ensure there is adequate phase matching between the two multitone input signals to the output combiner 70. The output combiner 70 recombines the amplified feed-forward signal 62 anti-phase with a delayed version of the output signal from main path ACT power amplifier stage 20 (shown in spectral diagram 76), so that, as shown at spectral diagram 78, very high distortion suppression is achieved and the linearity of the amplifier is significantly enhanced.

As noted briefly above, amplitude and phase alignment of the signals in loop 2 is controlled by the combination of the pilot tone generator 26 and a pilot tone receiver 80. The pilot tone generator 26 generates multitone signals that are injected at the output of the ACT PA 20 via directional coupler 24. These pilot tones are recovered by means of a first directional coupler 81 installed in the error amplifier output path to the first input 71 of combiner 70, and a directional coupler 82 installed in the main amplifier output path to the second input 72 of combiner 70. The outputs of the directional couplers 81 and 82 are fed to the pilot tone receiver 80. Pilot tones detected by the pilot tone receiver 80 are coupled to the digital signal processor 50, which measures the degree of amplitude and phase match of the detected pilot signals, and then drives the variable attenuator 47 and the phase shifter 48 to reduce the distortion at the output of the amplifier. Alternatively, the pilot receiver can use residual pilot signals at the output of combiner 70 to control vector modulator 46. In this scheme, the output of combiner 70 is sampled and fed into the pilot receiver, to detect the magnitude of the residual pilot signals at the output of the amplifier.

In accordance with a second embodiment of the invention, shown in FIG. 3, the ACT power amplifier stage 20 of FIG. 2, is replaced by a modified ACT power amplifier stage shown in FIG. 4. In this embodiment, the variable gain stage G3 and variable phase adjustor Φ2 at the input to the second (feed-forward) RF amplifier $A_2$ of the ACT stage of FIG. 1 are replaced by a controlled predistortion unit PreD. As a non-limiting, but preferred example, the controlled predistortion unit PreD in the feed-forward amplifier path may be of the type described in the above-referenced '241 Patent.

This augmented (high efficiency amplifier with predistortion enhancement) main path amplifier is labelled as ACT+PreD power amplifier stage 20A. In this embodiment, the ACT+PreD power amplifier 20A has the potential of being more linear than the ACT power amplifier stage 20 of the embodiment of FIG. 2, which allows higher levels of output intermodulation distortion (IMD)rejection. The embodiment of FIG. 3 operates essentially as the embodiment of FIG. 2, described above, with DSP 50 controlling the operation of the ACT architecture and predistorter PreD in the input signal path to amplifier 20A.

As detailed in the '241 Patent, the controlled predistortion unit in the feed-forward amplifier path of the ACT+PreD amplifier stage 20A preferably includes a processor-controlled vector modulator comprised of a phase shifter, a variable attenuator, and a predistorter. These three processor-controlled components are driven by respective control signals from the DSP 50. The variable phase shifter and attenuator adjust the phase and amplitude of the RF signal supplied via the predistorter to the feed-forward RF amplifier $A_2$, in accordance with respective phase and amplitude control signals from the DSP 50, and thereby introduce prescribed amounts of phase shift and attenuation to the carrier/inverted IMD distortion signal input to feed-forward RF amplifier $A_2$ within the ACT+PreD stage 20A. These phase and amplitude parameters are controlled, so that part of the IMD distortion is canceled within the feed-forward RF error amplifier $A_2$ and the remaining portion is canceled by the main path distortion summed in quadrature hybrid output combiner stage OCS.

As further described in the '241 Patent, the predistorter PreD may be used to distort the RF input signal to the auxiliary RF amplifier $A_2$, in accordance with auxiliary, work function-based predistortion control signals. These work function-based signals may be generated in the manner described in the U.S. Pat. No. 5,760,646 (or '646 patent), by D. Belcher et al, entitled: "Feed-Forward Correction Loop with Adaptive Predistortion Injection for Linearization of RF Power Amplifier," issued Jun. 2, 1998, assigned to the assignee of the present application and the disclosure of which is herein incorporated.

Figure 5:
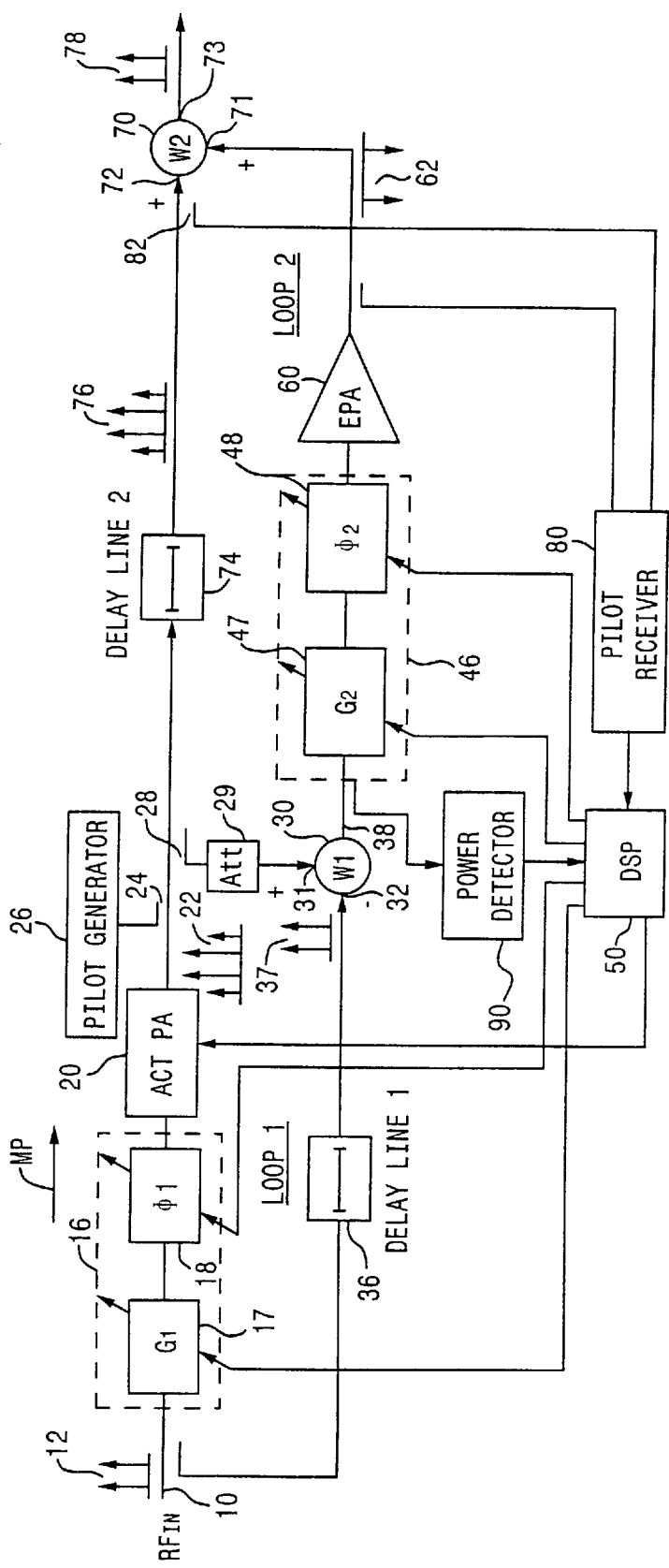
FIG. 5 diagrammatically illustrates a third embodiment of the present invention employing power-detection based carrier cancellation.

Pursuant to a third embodiment of the invention, shown in FIG. 5, the digital signal processor 50 of the embodiment of FIG. 2 is operative to maximize carrier rejection in loop 1. For this purpose, the correlator 40 and directional coupler 34 of FIG. 1 are replaced by a power detector 90, which has its input coupled to the directional coupler 38 at the output of the carrier cancellation combiner 30. In the embodiment of FIG. 5, the DSP 50 executes error minimization algorithms (e.g. minimization of the detected power of the output signal from carrier cancellation combiner 30), to generate signals for controlling attenuator 17 and phase shifter 18 in the input path to ACT power amplifier stage 20. As a non-limiting example, DSP 50 may execute a standard error minimization (e.g., least mean squared minimization) algorithm to define the amount of attenuation and phase shift distortion to be imparted by variable attenuator 17 and variable phase shifter 18, respectively.

Figure 6:
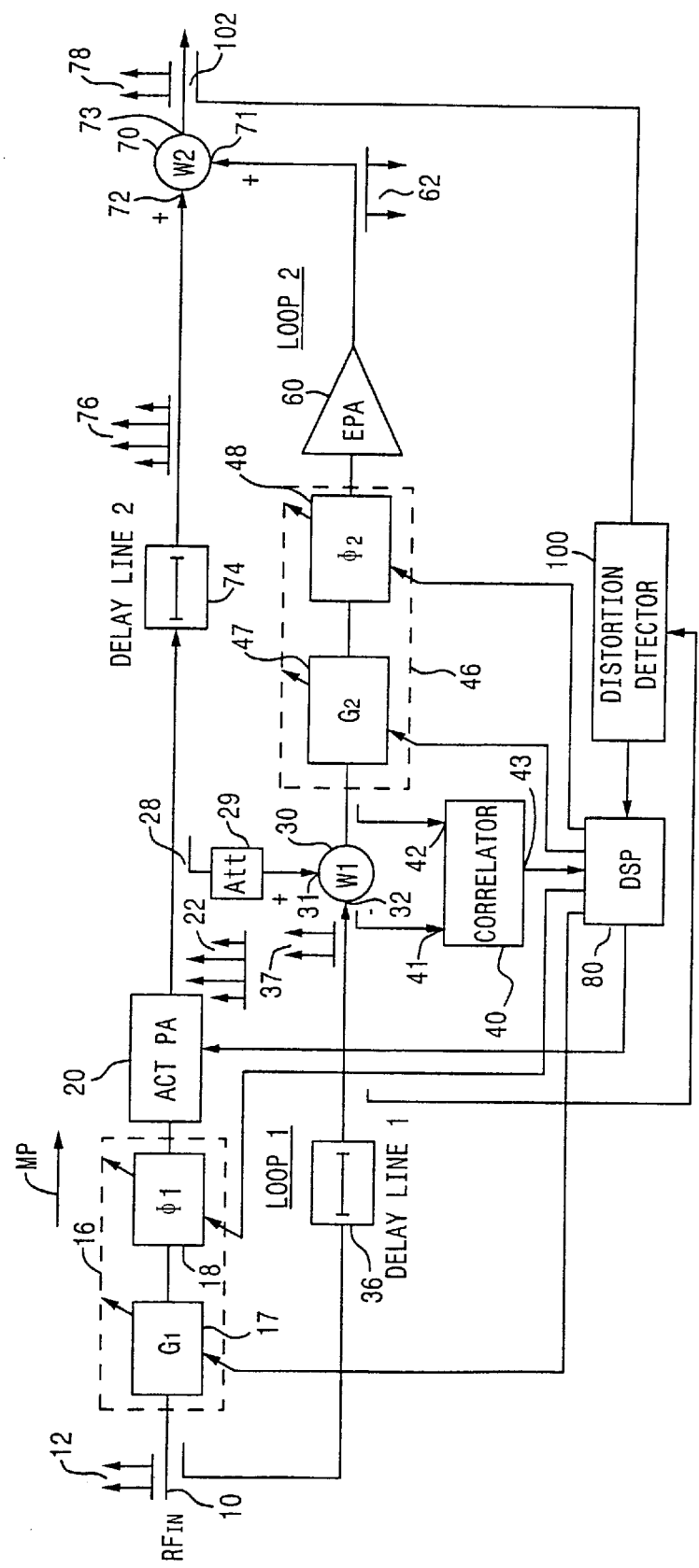
FIG. 6 diagrammatically illustrates a fourth embodiment of the present invention employing a distortion detector to adaptively control a vector modulator of the feed-forward loop.

In each of the embodiments of FIGS. 2–5, described above, amplitude and phase alignment of the signals in the feed-forward loop 2 is controlled by the combination of the pilot tone generator 26 and pilot tone receiver 80. Pursuant to a fourth embodiment of the invention, shown in FIG. 6, the pilot tone generator and receiver components of the embodiment of FIG. 2 are removed. In their place, the operation of loop 2 is controlled by the DSP 50, using signals from an output distortion detector (performance monitor) 100, to adaptively control the variable attenuator 47 and the phase shifter 48 to minimize the output distortion. The output distortion detector 100 is coupled to an output directional coupler 102 installed downstream of the output combiner 70. This embodiment offers improved amplifier linearity due to the fact that the distortion detector 100 continuously monitors the distortion at the output of the amplifier and uses this information to optimize distortion cancellation in loop 2.

Figure 7:
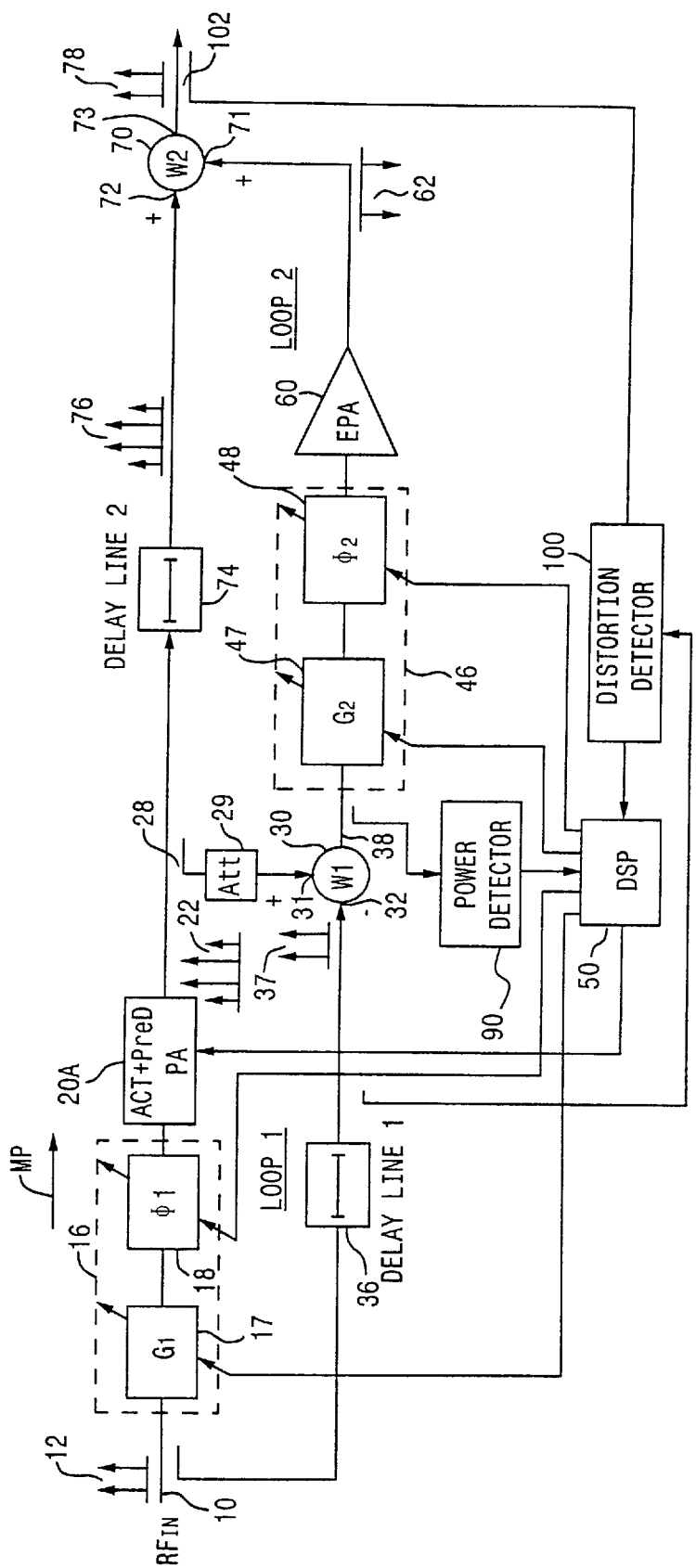
FIG. 7 diagrammatically illustrates a composite hybrid RF amplifier linearization architecture of the invention, which integrates features of the embodiments of FIGS. 2–6.

FIG. 7 diagrammatically illustrates a composite RF amplifier linearization architecture, which integrates the various features of the embodiments of FIGS. 2–6 described above to realize specific performance, complexity and cost objectives (e.g. the use of a loop 1 DSP controller, ACT+PreD amplifier stage, and distortion detector based control of loop 2). Like the embodiment of FIG. 6, the combined embodiment of FIG. 7 uses a distortion detector 100 in place of the pilot tone generator and receiver components for controlling loop 2. It also incorporates the ACT+PreD power amplifier 20A of the embodiment of FIGS. 3 and 4, as well as the detected power minimization scheme of the embodiment of FIG. 5, in place of the correlation mechanism of FIGS. 2–4.

As will be appreciated from the foregoing description, the combining of ACT and (enhanced) feed-forward techniques of the type described above-referenced '462 and '241 Patents enables the hybrid linearization scheme of the present invention to realize very high output distortion rejection and enhanced amplifier linearity. Compared to a classical feed-forward design, the invention is capable of achieving very large IMD suppression due to the utilization of an ACT power amplifier stage rather than a conventional class AB power amplifier. The combined ACT and feed-forward architecture also helps reduce dynamic amplifier distortion, which is not targeted by memoryless predistortion techniques such as work function based predistortion, described in the '646 patent. Moreover, being fundamentally an adaptive feed-forward architecture, the invention is unconditionally stable and achieves larger IMD correction than other amplifier linearization methods such as fifth order work function predistortion and peak envelope correction.

While we have shown and described various embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed is:

1. A RF power amplifier arrangement comprising:
an RF input port to which an RF input signal is applied;
an RF output port from which an RF output signal is derived;
an RF carrier cancellation loop coupled between said RF input port and said RF output port and including an RF amplifier stage that is operative to provide a first amplified RF output, said RF amplifying stage including first and second RF signal processing paths containing first and second matched RF power amplifiers coupled in circuit with one another in such a manner that said second matched amplifier is pre-distorted by the output of said first matched amplifier which is driven by essentially the same RF signals driving said second matched amplifier, said first and second RF signal processing paths being differentially combined to produce a composite RF output in which RF carrier components constructively combine and distortion introduced by said matched RF power amplifiers destructively combine;
a feed-forward amplifier loop coupled to said RF carrier cancellation loop and being operative to provide a second amplified RF output containing distortion introduced by said RF amplifier stage but effectively excluding said RF input signal; and
an output signal combiner coupled to receive said first and second amplified RF outputs of said RF carrier cancellation loop and said feed-forward amplifier loop, respectively, and being operative to produce a composite RF output signal, in which distortion introduced by said RF amplifier stage is reduced.

2. The RF power amplifier arrangement according to claim 1, wherein said RF amplifier stage includes a controlled predistortion unit.

3. The RF power amplifier arrangement according to claim 1, wherein said RF input signal comprises a multi-carrier RF signal.

4. The RF power amplifier arrangement according to claim 1, wherein said RF carrier cancellation loop includes a first vector modulator, and further including a correlator coupled with said carrier cancellation loop and being operative to provide an output associated with said RF input signal, and a processor, which is operative to process the output of said correlator and to control said first vector modulator in accordance therewith.

5. The RF power amplifier arrangement according to claim 4, wherein said feed-forward amplifier loop includes a second vector modulator, and further including a pilot tone generator, which is operative to inject a pilot tone into said first amplified RF output of said RF amplifying stage, and a pilot tone receiver coupled to said first amplified RF output of said RF amplifying stage and to said second amplified RF output of said feed-forward amplifier loop, and being operative to detect pilot tone energy therein, and wherein said processor is coupled to said pilot tone receiver and is operative to control said second vector modulator, in accordance with said pilot tone energy detected by said pilot tone receiver.

6. The RF power amplifier arrangement according to claim 1, wherein said feed-forward amplifier loop includes a first vector modulator, and further including a pilot tone generator, which is operative to inject a pilot tone into said first amplified RF output of said RF amplifying stage, and a pilot tone receiver coupled to said first amplified RF output of said RF amplifying stage and to said second amplified RF output of said feed-forward amplifier loop, and being operative to detect pilot tone energy therein, and a processor coupled to said pilot tone receiver and being operative to control said first vector modulator, in accordance with said pilot tone energy detected by said pilot tone receiver.

7. The RF power amplifier arrangement according to claim 6, wherein said RF carrier cancellation loop includes a second vector modulator, and further including a power detector coupled with said carrier cancellation loop and being operative to provide an output representative of power in residual distortion of said RF amplifier stage, and wherein said processor is operative to control said second vector modulator in accordance with the output of said power detector.

8. The RF power amplifier arrangement according to claim 1, wherein said RF carrier cancellation loop includes a first vector modulator, and further including a power detector coupled with said carrier cancellation loop and being operative to provide an output representative of power in residual distortion of said RF amplifier stage, and a processor, which is operative to control said first vector modulator in accordance with the output of said power detector.

9. The RF power amplifier arrangement according to claim 8, wherein said feed-forward amplifier loop includes a second vector modulator, and further including a pilot tone generator, which is operative to inject a pilot tone into said first amplified RF output of said RF amplifying stage, and a pilot tone receiver coupled to said first amplified RF output of said RF amplifying stage and to said second amplified RF output of said feed-forward amplifier loop, and being operative to detect pilot tone energy therein, and wherein said processor is coupled to said pilot tone receiver and is operative to control said second vector modulator, in accordance with said pilot tone energy detected by said pilot tone receiver.

10. The RF power amplifier arrangement according to claim 1, wherein said feed-forward amplifier loop includes a first vector modulator, and further including a distortion detector coupled to monitor distortion in said composite RF output signal, and a processor, which is operative to control said first vector modulator in accordance with distortion monitored by said distortion detector.

11. The RF power amplifier arrangement according to claim 10, wherein said RF carrier cancellation loop includes a second vector modulator, and further including a correlator coupled with said carrier cancellation loop and being operative to provide an output associated with said RF input signal, and wherein said processor is operative to process the output of said correlator and to control said second vector modulator in accordance therewith.

12. The RF power amplifier arrangement according to claim 11, wherein said RF amplifier stage includes a controlled predistortion unit.

13. The RF power amplifier arrangement according to claim 1, wherein
said first RF signal processing path includes a first controlled RF signal vector modulator, that is controllably operative to adjust one or more parameters of a first RF input signal component applied to said first matched RF power amplifier,
said second RF signal processing path includes a second controlled RF signal vector modulator, that is controllably operative to adjust one or more parameters of a second RF input signal component applied to said second matched RF power amplifier,
an intermodulation distortion (IMD) extraction circuit coupled to an output of said first matched RF power amplifier and being operative to generate said second RF input signal component as a combination of said RF input signal and an IMD component present in an amplified RF output signal from said first matched RF power amplifier, and
a signal combiner coupled to outputs of said first and second matched RF power amplifiers and being operative to produce said first amplified output as a composite RF signal, in which RF carrier components produced by each of said first and second matched RF power amplifiers constructively sum and IMD components produced thereby destructively combine.

14. The RF power amplifier arrangement according to claim 13, wherein said IMD extraction circuit includes a cancellation combiner that is operative to differentially combine an amplified RF output produced by said first matched RF power amplifier with a portion of said RF input signal applied to said second signal processing path to derive said IMD component, and to combine said IMD component with said portion of the RF input signal applied to said second signal processing path, so as to derive said second RF input signal component as a combination of said RF input signal and said IMD component that is phase complementary to said RF input signal.

15. A multicarrier RF power amplifier comprising:
an RF input port adapted to receive a multicarrier RF input signal;
an RF output port from which an amplified multicarrier RF output signal is derived;
an RF amplifier stage coupled in circuit with a first vector modulator to said RF input port and being operative to provide a first amplified multicarrier RF output, said RF amplifying stage including first and second RF signal processing paths containing first and second matched RF power amplifiers that are coupled in circuit with one another in such a manner that said second matched amplifier is pre-distorted by the output of said first matched amplifier which is driven by essentially the same RF signals driving said second matched amplifier, said first and second RF signal processing paths being differentially combined to produce a composite amplified multicarrier RF output in which RF carrier components of said multicarrier RF input signal constructively combine and distortion introduced by said first and second matched RF power amplifiers destructively combine;
an RF carrier cancellation loop coupled to said RF input port and to said RF amplifier stage and being operative to extract distortion energy imparted to said first amplified multicarrier RF output by said RF amplifier stage;
a feed-forward amplifier loop coupled to said RF carrier cancellation loop and including a feed-forward RF amplifier stage coupled in circuit with a second vector modulator, and being operative to provide a second amplified RF output containing distortion introduced by said RF amplifier stage but effectively excluding said multicarrier RF input signal; and
an output signal combiner coupled to receive outputs of said RF carrier cancellation loop and said feed-forward amplifier loop, and being operative to produce a composite multicarrier RF output signal, in which distortion introduced by said RF amplifier stage is effectively reduced.

16. The multicarrier RF power amplifier according to claim 15, wherein said RF amplifier stage includes a controlled predistortion unit.

17. The multicarrier RF power amplifier according to claim 15, further including a correlator coupled with said carrier cancellation loop and being operative to provide an output associated with said multicarrier RF input signal, and a processor, which is operative to process the output of said correlator and to control said first vector modulator in accordance therewith.

18. The multicarrier RF power amplifier according to claim 17, further including a pilot tone generator, which is operative to inject a pilot tone into said first amplified multicarrier RF output of said RF amplifying stage, and a pilot tone receiver coupled to said first amplified multicarrier RF output of said RF amplifying stage and to said second amplified RF output of said feed-forward RF amplifier stage, and being operative to detect pilot tone energy therein, and wherein said processor is coupled to said pilot tone receiver and is operative to control said second vector modulator, in accordance with said pilot tone energy detected by said pilot tone receiver.

19. The multicarrier RF power amplifier according to claim 17, further including a distortion detector coupled to monitor distortion in said composite RF output signal, and wherein said processor is operative to control said first vector modulator in accordance with distortion monitored by said distortion detector.

20. The multicarrier RF power amplifier according to claim 15, further including a power detector coupled with said carrier cancellation loop and being operative to provide an output representative of power in residual distortion of said RF amplifier stage, and a processor operative to control said second vector modulator in accordance with the output of said power detector.

* * * * *